(12) United States Patent
Kirby et al.

(10) Patent No.: US 7,410,898 B2
(45) Date of Patent: *Aug. 12, 2008

(54) METHODS OF FABRICATING INTERCONNECTS FOR SEMICONDUCTOR COMPONENTS

(75) Inventors: Kyle K. Kirby, Boise, ID (US); Shuang Meng, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/705,897

(22) Filed: Feb. 13, 2007

(65) Prior Publication Data

US 2007/0141835 A1 Jun. 21, 2007

Related U.S. Application Data

(60) Continuation of application No. 11/028,892, filed on Jan. 3, 2005, now Pat. No. 7,189,642, which is a division of application No. 10/784,074, filed on Feb. 20, 2004, now Pat. No. 6,943,106.

(51) Int. Cl.
*H01L 21/44* (2006.01)
(52) U.S. Cl. ............... 438/667; 438/672; 438/675; 257/E21.585
(58) Field of Classification Search ........... 438/637, 438/667, 672, 675, 678; 257/E21.585
See application file for complete search history.

(56) References Cited

U.S. PATENT DOCUMENTS

| 6,107,109 A | 8/2000 | Akram et al. ............. 438/15 |
| 6,114,240 A | 9/2000 | Akram et al. ............. 438/667 |
| 6,294,837 B1 | 9/2001 | Akram et al. ............. 257/774 |
| 6,459,150 B1 | 10/2002 | Wu et al. ............. 297/724 |
| 6,943,106 B1 * | 9/2005 | Kirby et al. ............. 438/637 |
| 7,071,098 B2 * | 7/2006 | Kirby et al. ............. 438/637 |

(Continued)

FOREIGN PATENT DOCUMENTS

CN 1392510 A 1/2003

(Continued)

OTHER PUBLICATIONS

Electroless Plating; http://www.corrosion-doctors.org/MetalCoatings/Electroless.htm: Dec. 5, 2003; pp. 1-4.

(Continued)

*Primary Examiner*—Hsien-Ming Lee
(74) *Attorney, Agent, or Firm*—Wells St. John P.S.

(57) ABSTRACT

In one aspect, the invention encompasses a method of fabricating an interconnect for a semiconductor component. A semiconductor substrate is provided, and an opening is formed which extends entirely through the substrate. A first material is deposited along sidewalls of the opening at a temperature of less than or equal to about 200° C. The deposition can comprise one or both of atomic layer deposition and chemical vapor deposition, and the first material can comprise a metal nitride. A solder-wetting material is formed over a surface of the first material. The solder-wetting material can comprise, for example, nickel. Subsequently, solder is provided within the opening and over the solder-wetting material.

13 Claims, 9 Drawing Sheets

U.S. PATENT DOCUMENTS

| | | | |
|---|---|---|---|
| 7,189,642 B2 * | 3/2007 | Kirby et al. | 438/637 |
| 2001/0027011 A1 | 10/2001 | Hanaoka et al. | 438/637 |
| 2003/0082356 A1 | 5/2003 | Suemasu et al. | 428/209 |
| 2003/0219979 A1 | 11/2003 | Choi et al. | |
| 2004/0084782 A1 | 5/2004 | Magerlein et al. | 257/777 |
| 2004/0115929 A1 | 6/2004 | Lim | 438/643 |
| 2004/0182714 A1 | 9/2004 | Imori et al. | 205/123 |
| 2004/0201095 A1 | 10/2004 | Palmer et al. | 257/700 |
| 2004/0229457 A1 | 11/2004 | Chan et al. | 438/643 |
| 2005/0064707 A1 | 3/2005 | Sinha | 438/667 |
| 2005/0275048 A1 | 12/2005 | Farnworth et al. | 257/431 |
| 2005/0285154 A1 | 12/2005 | Akram et al. | 257/234 |

FOREIGN PATENT DOCUMENTS

| | | | |
|---|---|---|---|
| WO | US2005/006116 | | 2/2005 |
| WO | 06116IPER | | 8/2007 |

OTHER PUBLICATIONS

Electroless Plating; http://www.corrosion-doctors.org/MetalCoatings/Electroless.htm: Oct. 20, 2003; pp. 1-2.

Slide Show: "Through-Wafer *Copper Electroplating for RF Silicon Technology*"; N.T. Nguyen et al.: DIMES-TU Delft, Netherlands; http://www.essderc2002.deis.unibo.it/ESSDERC_web/Session_D11/D11_2.pdf.

"Kinetic modeling of film growth rates of TiN films in atomic layer deposition", Jung-Wook Lim et al. Journal of Applied Physics; vol. 87, No. 9; May 1, 2000; pp. 4632-4634.

Min, Jae-Sik, et al. "Atomic Layer Deposition of TiN Films by Alternate Supply of Tetrak(ethylmethylamino)-Titanium and Ammonia" Japanese Journal of Applied Physics, vol. 37 (1998) pp. 4999-5004.

* cited by examiner

METHODS OF FABRICATING INTERCONNECTS FOR SEMICONDUCTOR COMPONENTS

RELATED PATENT DATA

This patent resulted from a continuation application of U.S. patent application Ser. No. 11/028,892, which was filed Jan. 3, 2005, which is now U.S. Pat. No. 7,189,642, and which is hereby incorporated by reference; which is a divisional application of U.S. patent application Ser. No. 10/784,074, which was filed Feb. 20, 2004, which is now U.S. Pat. No. 6,943,106, and which is hereby incorporated by reference.

TECHNICAL FIELD

The invention pertains to methods of fabricating interconnects for semiconductor components.

BACKGROUND OF THE INVENTION

Semiconductor components, such as dice, wafers and chip scale packages, are fabricated to include external contacts to allow electrical connections to be made from the outside of the components to integrated circuits contained on the components. A semiconductor die, for example, typically includes patterns of bond pads formed on a face of the die. At the wafer level, the bond pads are used for probe testing the integrated circuits on the die. At the die level, the bond pads are used for testing, and also for making electrical connections, such as wire bonds, for packaging. Typically, the bond pads comprise planar aluminum pads, or alternatively solder bumps on solder wettable pads.

The interconnects described above are but one type of interconnect that can be utilized with semiconductor components. Numerous other types of interconnects are known. For instance, semiconductor packages, such as chip scale packages, can utilize solder balls arranged in a dense array, such as a ball grid array (BGA), or fine ball grid array (FBGA).

FIGS. 1-5 illustrate an exemplary semiconductor component 10 having interconnects associated therewith. FIG. 1 is a top view of a fragment of the component 10, and shows a plurality of conductive traces 12, 14, 16, 18, 20, 22, 24, 26, 28, 30, 32, 34 and 36. The conductive traces extend from inner lead bond pads 38, 40, 42, 44, 46, 48, 50, 52, 54, 56, 58, 60 and 62 to outer lead bonds 64, 66, 68, 70, 72, 74, 76, 78, 80, 82, 84, 86 and 88. The shown relative sizes of the outer lead bonds and inner lead bonds are for diagrammatic purposes only. Accordingly, although the inner lead bonds are shown uniform in size and larger than the outer lead bonds which are also uniform in size, it is to be understood that the constructions can also have inner lead bonds and/or outer lead bonds which are not uniform in size, and can have inner lead bonds which are smaller than the outer lead bonds.

FIGS. 2 and 3 show a top view and a cross-sectional side view of an expanded region of the FIG. 1 fragment. Such views show that the trace 18 is a layer 100 of conductive material. Outer lead bond 70 comprises a solder ball 102 over a nickel-containing solder-wettable material 104. Inner lead bond 44 comprises a solder interconnect 106 having a conductive material cap 108 thereover. Conductive material cap 108 can comprise, for example, nickel and/or a solder ball.

Trace 100 can be referred to as a redistribution layer, in that it distributes an electrical signal from the central location of the inner lead bond 44 to the laterally outward location of outer lead bond 70 and vice versa.

The semiconductor component of fragment 10 comprises a semiconductor die 110 which can correspond to, for example, a monocrystalline silicon wafer. The die 110 has various levels of integrated circuitry (not shown) associated therewith. An electrically insulative passivation layer 112 extends around die 110 and insulates the die from the solder material 106. Passivation layer 112 can comprise, consist essentially of, or consist of silicon dioxide, and will typically have a thickness of from about 2000 Å to about 8000 Å. An insulative material 114 is provided over passivation layer 112, and is utilized to support circuit trace 100, and can also be utilized during patterning of circuit trace 100. Layer 114 can comprise, for example, polyimide.

Semiconductor die 110 can be considered a semiconductor substrate, or alternatively the die 110 in combination with various other materials of component 10 can be considered a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The die 110 has two opposing sides 111 and 113, which are typically referred to as a front side and a back side, respectively. Component 10 has opposing outer surfaces 115 and 117 that are proximate the front side 111 and the back side 113, respectively, of die 110. Surfaces 115 and 117 can be referred to as a front-side surface and back-side surface, respectively, of component 10.

Solder material 106 extends entirely through component 10, and accordingly extends from the front-side surface 115 of the component to the back-side surface 117 of the component. Solder material 106 can ultimately be utilized for an electrical connection to an external device proximate back-side surface 117, and can be utilized for electrically interconnecting such device to another device associated with pad 102 of outer lead 70.

A method of forming the structure of FIGS. 2 and 3 is described with reference to FIGS. 4 and 5. Specifically, the construction 10 is shown prior to formation of leads 44 and 70 (FIGS. 2 and 3). A hole 130 is etched through component 10 to extend from front-side surface 115 to back-side surface 117. The hole can be formed by, for example, laser-etching. The hole comprises a depth 132 extending from the front-side surface 115 to the back-side surface 117, and comprises a width dimension 134 orthogonal to the depth. The hole can be substantially circular when viewed from above (as shown), and accordingly width dimension 134 can correspond to a diameter of the circle. Alternatively, the hole can have a polygonal shape (such as, for example, a square shape) when viewed from above. Regardless of the shape of the hole 130, the maximum width dimension will typically be less than or equal to about 100 microns, and frequently will be less than or equal to about 35 microns.

A problem is encountered in uniformly filling hole 130 with solder. Specifically, the small dimension of hole 130 makes it difficult to flow solder into the hole. Various efforts have been made to provide solder-wetting agents along the peripheral sidewalls of the hole 130 in order to draw the solder into the hole. However, the provision of the solder-wetting agents will frequently comprise relatively high-temperature processing (specifically, processing in excess of 300° C.), which can adversely impact circuitry associated with die 110. Accordingly, it is desired to develop new methods for forming interconnects within semiconductor components.

SUMMARY OF THE INVENTION

In one aspect, the invention encompasses a method of fabricating an interconnect for a semiconductor component. A semiconductor substrate is provided, and an opening is formed which extends entirely through the substrate. A first material is deposited along sidewalls of the opening at a temperature of less than or equal to about 200° C. A second material is then plated within the opening and over the first material.

In one aspect, the invention encompasses a method of fabricating an interconnect for a semiconductor component. A semiconductor substrate is provided and an opening is formed to extend entirely through the substrate. A metal nitride is deposited along sidewalls of the opening. The deposition is conducted in a reaction chamber utilizing a first precursor containing the metal of the metal nitride, and a second precursor containing the nitrogen of the metal nitride. The deposition comprises at least one cycle in which the first and second precursors are in the reaction chamber at different and substantially non-overlapping time intervals relative to one another. A second material is subsequently plated within the opening and over the metal nitride.

BRIEF DESCRIPTION OF THE DRAWINGS

Preferred embodiments of the invention are described below with reference to the following accompanying drawings.

FIG. 17 is a diagrammatic, cross-sectional view of an exemplary deposition apparatus which can be utilized in various aspects of the present invention.

DETAILED DESCRIPTION OF THE PREFERRED EMBODIMENTS

Figure 1:
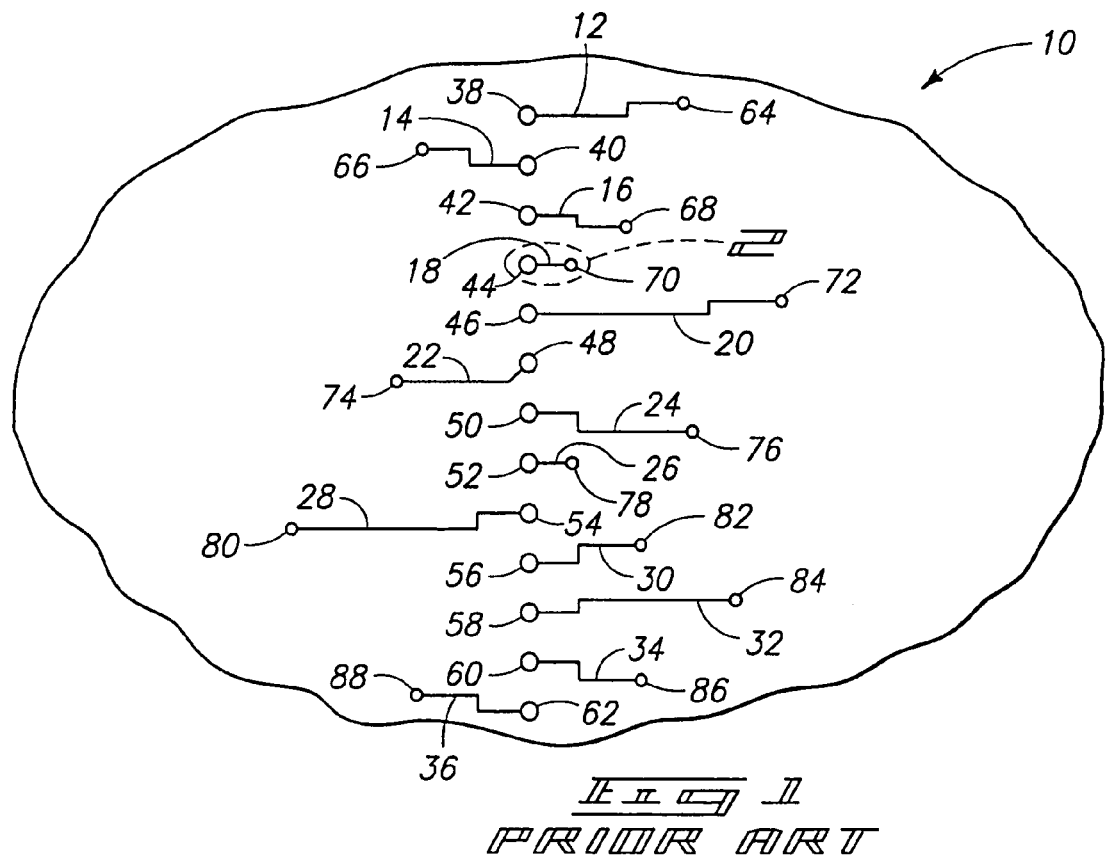
FIG. 1 is a diagrammatic top view of a prior art semiconductor component construction.
Figure 2:
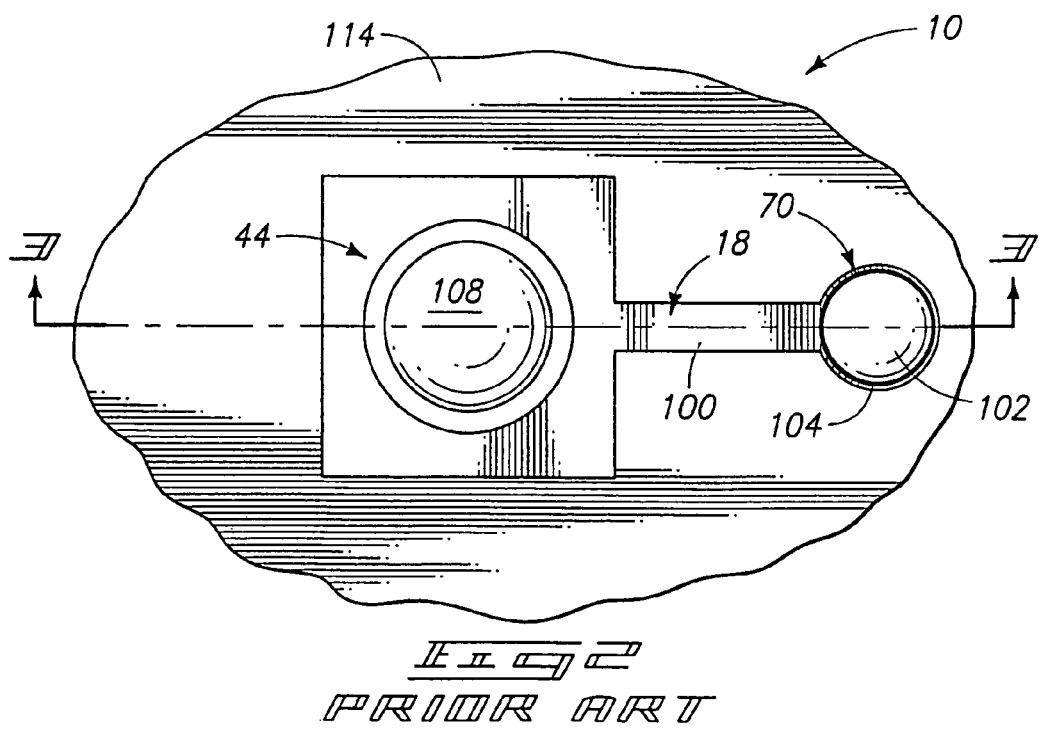
FIG. 2 is an enlarged view of the region 2 of the FIG. 1 prior art construction.
Figure 3:
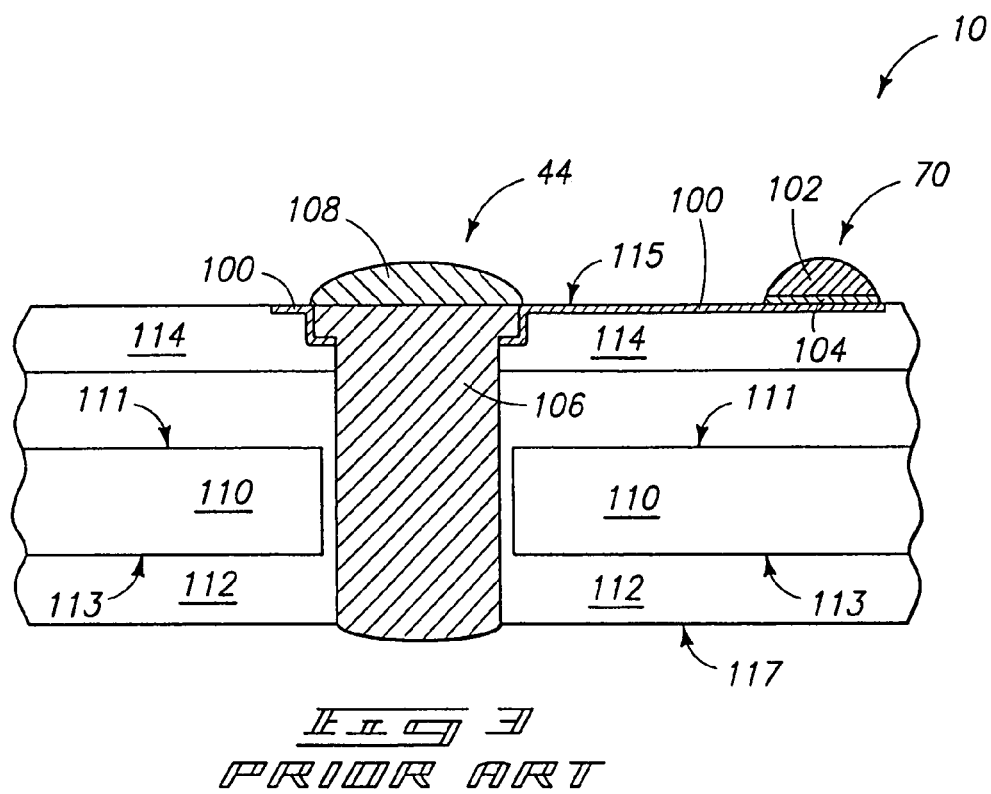
FIG. 3 is a view along the line 3-3 of the FIG. 2 prior art construction.

This disclosure of the invention is submitted in furtherance of the constitutional purposes of the U.S. Patent Laws "to promote the progress of science and useful arts" (Article 1, Section 8).

In particular aspects, the invention encompasses methods for forming solder within openings extending through semiconductor components. Low temperature deposition is utilized to form a film within an opening. The film can comprise a metal nitride, such as, for example, titanium nitride. A surface of the film is plated with a solder-wetting material (such as, for example, nickel). The plating can comprise activation of the surface, (such as, for example, by dipping the film in a solution comprising hafnium and/or palladium), followed by electroless plating of the activated surface with the solder-wetting material. Alternatively, the plating can comprise utilization of activationless plating chemistry to form a plating on the surface. The activationless plating chemistry can utilize reduced stabilizer content and can utilize the TiN of the film to carry an electrical potential for the plating chemical reaction. As another example, a low temperature TiN film can be used as a low temperature base or adhesion layer for another low temperature chemical vapor deposited layer (such as, for example, tungsten). The solder-wetting material can then be plated onto the low temperature chemical vapor deposited layer.

After formation of the solder-wetting material over the film, solder can be drawn into the opening along the solder-wetting material to fill the opening.

The low-temperature deposition of the film is preferably conducted at a temperature of less than or equal to about 200° C. so that a temperature of the semiconductor component does not exceed 200° C. during the deposition. Suitable deposition technologies can comprise atomic layer deposition (ALD) and/or chemical vapor deposition (CVD). To assist the reader in understanding the invention, ALD technology and CVD technology will be initially described in some detail. Referring first to ALD technology, such typically involves formation of successive atomic layers on a substrate. Such layers may comprise, for example, an epitaxial, polycrystalline, and/or amorphous material. ALD may also be referred to as atomic layer epitaxy, atomic layer processing, etc.

Described in summary, ALD includes exposing an initial component to a first chemical species to accomplish chemisorption of the species onto the component. Theoretically, the chemisorption forms a monolayer that is uniformly one atom or molecule thick on the entire exposed initial component. In other words, a saturated monolayer. Practically, as further described below, chemisorption might not occur on all portions of the component. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the component and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the component and/or monolayer with a carrier gas and/or lowering pressure to below the deposition pressure to reduce the concentration of a species contacting the component and/or chemisorbed species. Examples of carrier gases include $N_2$, Ar, He, Ne, Kr, Xe, etc. Purging may instead include contacting the component and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a component to which the first species may form chemical bonds. The second species might only bond to the first species and thus may also be self-limiting. Once all of the finite number of sites on a component are bonded with a first species, the first species will often not bond to other of the first species already bonded with the component. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma-enhanced CVD and others. CVD is commonly used to form non-selectively a complete, deposited material on a component. One characteristic of CVD is the simultaneous presence of multiple species in the deposition chamber that react to form the deposited material. Such condition is contrasted with the purging criteria for traditional ALD wherein a component is contacted with a single deposition species that chemisorbs to a component or previously deposited species. An ALD process regime may provide a simultaneously contacted plurality of species of a type or under conditions such that ALD chemisorption, rather than CVD reaction occurs. Instead of reacting together, the species may chemisorb to a component or previously deposited species, providing a surface onto which subsequent species may next chemisorb to form a complete layer of desired material.

Under most CVD conditions, deposition occurs largely independent of the composition or surface properties of an underlying component. By contrast, chemisorption rate in ALD might be influenced by the composition, crystalline structure, and other properties of a component or chemisorbed species. Other process conditions, for example, pressure and temperature, may also influence chemisorption rate. Accordingly, observation indicates that chemisorption might not occur appreciably on portions of a component though it occurs at a suitable rate on other portions of the same component. Such a condition may introduce intolerable defects into a deposited material.

Figure 5:
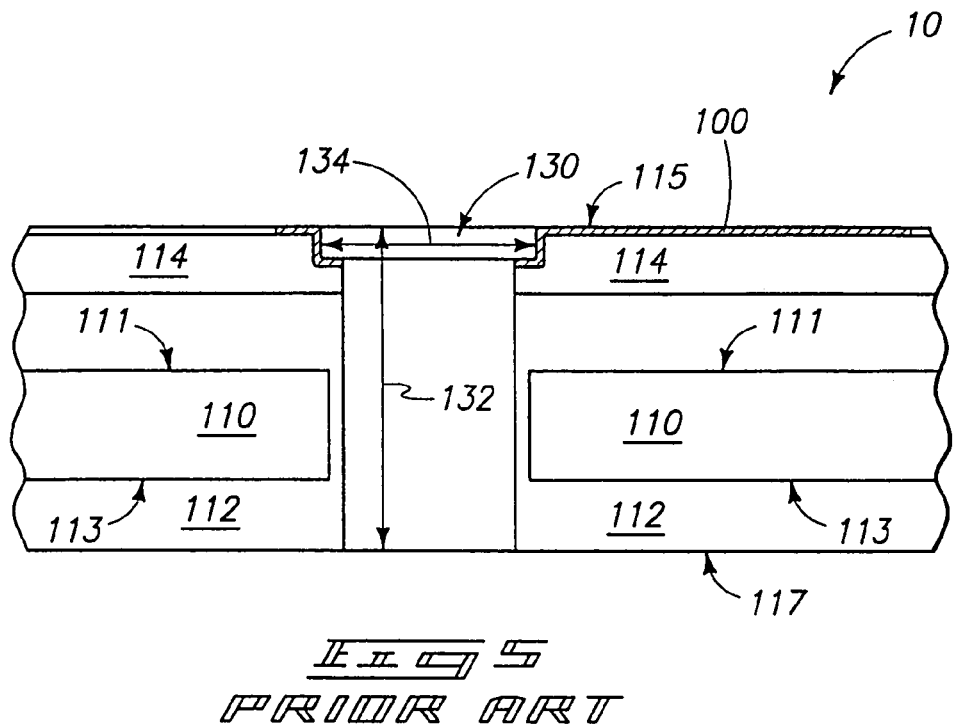
FIG. 5 is a cross-sectional view along the line 5-5 of the FIG. 4 prior art construction.
Figure 6:
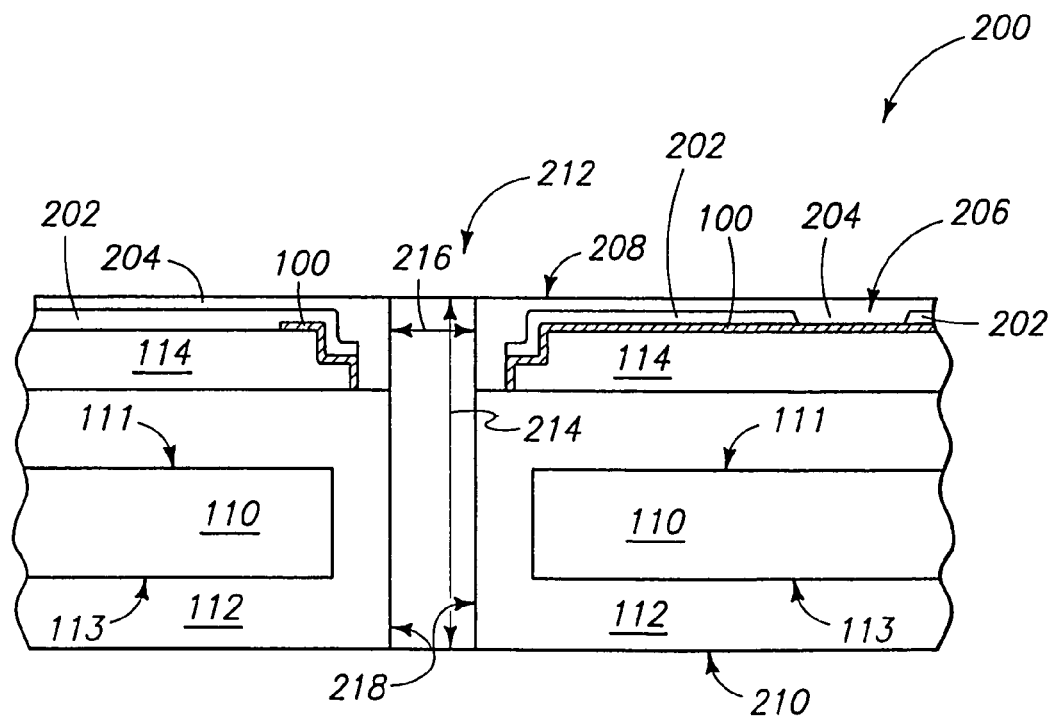
FIG. 6 is a diagrammatic, cross-sectional view of a semiconductor component at a preliminary processing stage of an exemplary method of the present invention.

An exemplary method of the present invention is described with reference to FIGS. 6-13. Referring initially to FIG. 6, such shows a fragment of a construction 200 at a preliminary processing stage. Construction 200 comprises several of the structures described previously with reference to FIGS. 1-5, and such structures are labeled identically in construction 200 as they were labeled in FIGS. 1-5. Accordingly, construction 200 is shown to comprise a semiconductor component 110 having a front side 111 and a back side 113, and further is shown to comprise a passivation layer 112 extending around component 110. Construction 200 further comprises a conductive metal trace 100 analogous to the trace described previously, and comprises a thick passivation layer 114 beneath trace 100. The thick passivation layer can be, for example, a polyimide-containing layer.

Construction 200 differs from the construction 10 of FIGS. 1-5 in that construction 200 comprises a pair of insulative-material layers 202 and 204 over conductive-material layer 100. Insulative material layers 202 and 204 can be referred to as a first and second insulative-material layer, respectively. Insulative-material layer 202 can comprise, for example, polyimide, and insulative-material layer 204 can comprise, for example, silicon dioxide formed by low-temperature deposition. Insulative-material layer 202 is patterned to have a gap 206 extending therethrough, which is ultimately to be a location for an outer lead bond.

Construction 200 can be considered a semiconductor component, and such component comprises a front-side surface 208 outwardly of the front side of semiconductor die 110, and a back-side surface 210 outwardly of the back side 113 of die 110.

An opening 212 extends entirely through semiconductor component 200, and specifically extends from front-side surface 208 to back-side surface 210. Opening 212 comprises a depth 214 between the front-side surface 208 and the back-side surface 210, and comprises a width 216 orthogonal to the depth 214. Opening 212 can have any suitable shape when viewed from above, including, for example, a substantially circular shape. If opening 212 is substantially circular when viewed from above, then width 216 will correspond to a diameter of the circle. Regardless of the shape of opening 212, the opening will have a maximum cross-sectional width. In particular aspects, such maximum cross-sectional width will be less than about 100 microns, and in further aspects such maximum cross-sectional width will be less than about 35 microns.

Opening 212 has sidewall peripheries 218 which comprise a surface of passivation material 112 and a surface of insulative material 204. In particular aspects, materials 204 and 112 can comprise the same composition as one another, and specifically can comprise, consist essentially of, or consist of silicon dioxide. Accordingly, sidewalls 218 can comprise, consist essentially of, or consist of silicon dioxide along the entirety of the sidewalls.

As discussed previously, structure 110 can comprise a semiconductor die, and in particular aspects will comprise a monocrystalline semiconductor material, such as, for example, a monocrystalline silicon wafer. Accordingly, opening 212 can be considered to extend through a monocrystalline silicon wafer in some aspects of the invention.

It is noted that an interface between materials 204 and 112 should be shown in the opening 212 of FIG. 6 as such interface would be visible behind the plane of the opening. However, such interface is not shown within the opening in order to simplify the drawings. Generally, interfaces occurring behind the illustrated planes of the cross-sectional views of this disclosure will not be shown, except in instances in which it is believed that the showing of such interfaces will enhance clarity in the drawings and/or description.

Structures 114, 100, 202 and 204 can be considered to be proximate the front side 111 of structure 110. Specifically, the structures 114, 100, 202 and 204 are closer to the front side 111 than to the back side 113.

Figure 4:
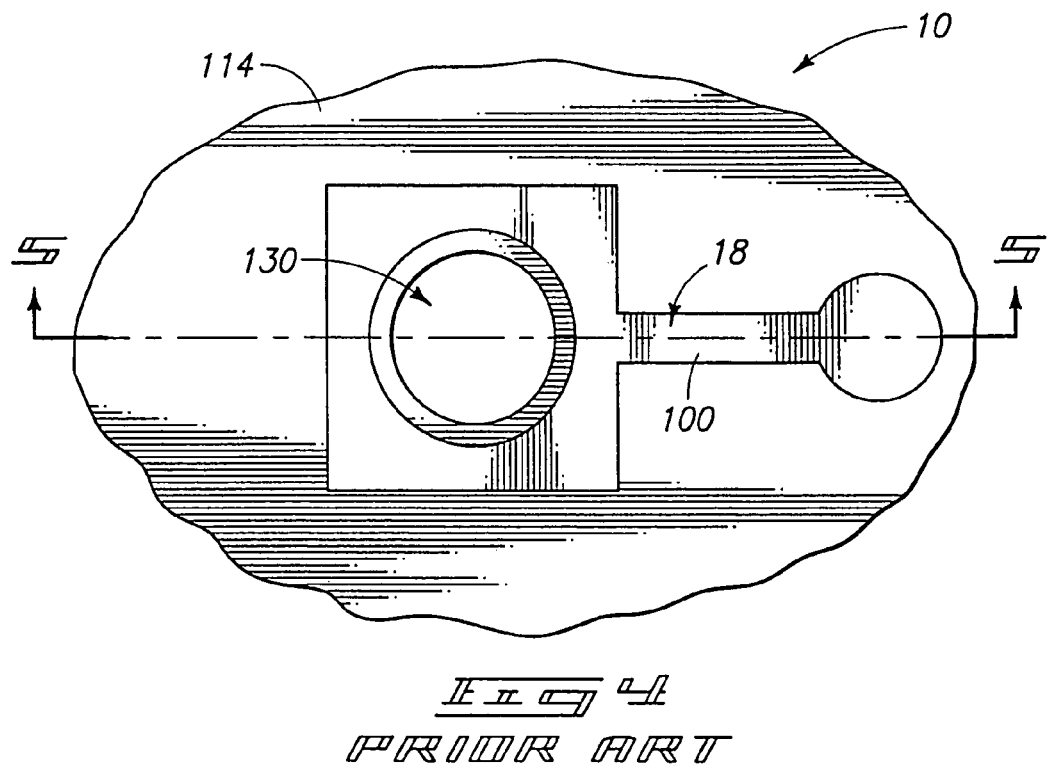
FIG. 4 is a view of a prior art construction at a processing stage prior to that of FIG. 2.

The processing described previously with reference to FIGS. 4 and 5 showed a hole 130 punched through conductive material 100, and accordingly the hole 130 comprised a periphery containing the conductive material 100. A difference between the FIG. 6 structure 200 and the structure described with reference to FIGS. 4 and 5 is that hole 212 does not comprise a periphery extending entirely to conductive material 100. Construction 200 can be formed by initially forming conductive-material layer 100 to be patterned such that the material 100 comprises a gap extending therethrough where hole 212 is ultimately to be formed. The gap can then be filled with the electrically-insulative material 204, and the opening 212 can be punched through electrically-insulative material 204.

Although construction 200 is shown with opening 212 not contacting conductive material 100, it is to be understood that the processing of FIGS. 4 and 5 could be utilized instead of the shown processing. Accordingly the opening could be formed through a conductive pad of material as shown in FIGS. 4 and 5, and could have a periphery comprising the conductive material of the pad.

Figure 7:
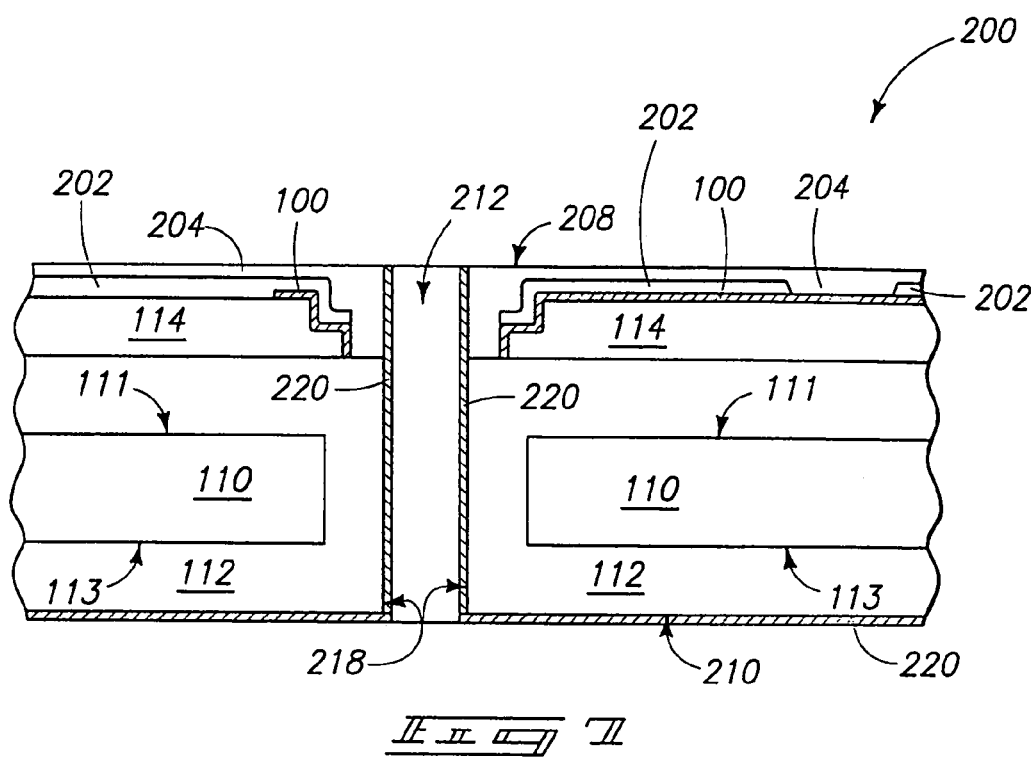
FIG. 7 is a view of the FIG. 6 fragment shown at a processing stage subsequent to that of FIG. 6.

Referring next to FIG. 7, a layer (which can also be referred to herein as a film) 220 is deposited within opening 212 along sidewalls 218, and also along back-side surface 210 of component 200. Layer 220 can comprise an electrically-conductive material, and in particular aspects will comprise, consist essentially of, or consist of metal nitride. For instance, layer 220 can comprise, consist essentially of, or consist of one or more of titanium nitride, tungsten nitride, tantalum nitride and hafnium nitride. Layer 220 can be referred to as a first material in particular aspects of the invention to distinguish layer 220 from subsequent materials formed within opening 212.

Although layer 220 is described as being formed over back-side surface 210, it is to be understood that layer 220 can be alternatively considered to define a new back-side surface so that the back-side surface 210 becomes associated with layer 220 rather than with material 112. However, as will become apparent from the discussion that follows, the portion of layer 220 associated with the back side of construction 200 is ultimately removed, so it is simpler for the discussion herein if the back-side surface is considered to remain associated with material 112 even after formation of layer 220.

Layer 220 can be formed by, for example, ALD and/or CVD, and is preferably formed at a temperature of less than or equal to about 200° C. The utilization of temperatures at or below 200° C. can avoid problems discussed above in the "Background" section of this disclosure, and specifically can avoid heating circuitry associated with die 110 (not shown) to temperatures which can adversely impact the circuitry.

FIG. 17 shows an exemplary deposition apparatus 1000 that can be utilized for forming layer 220. Apparatus 1000 comprises a reaction chamber 1002. An inlet 1004 extends into the reaction chamber, and a valve 1006 is provided across inlet 1004 for controlling flow of materials through the inlet. An outlet 1008 also extends into the reaction chamber, and a valve 1010 is provided to control flow of materials through the outlet.

A substrate holder 1012 is provided within the reaction chamber, and such is shown holding an exemplary substrate 1014. Substrate 1014 can correspond to, for example, the semiconductor component 200 of FIGS. 6 and 7.

In operation, materials are flowed into chamber 1002 through inlet 1004, and expelled from chamber 1002 through outlet 1008. The materials flowed into the chamber are represented by arrow 1016, and the materials expelled from the chamber represented by arrow 1018. The materials flowed into chamber 1002 can be suitable reactants (i.e., one or more precursors), carrier gases, purge gases, etc.

If apparatus 1000 is utilized for an ALD-type process, two precursors can be introduced into the chamber at different and substantially non-overlapping time intervals relative to one another. Specifically, a first precursor can be introduced into the chamber to form a first substantially-saturated monolayer over an exposed surface of substrate 1014, and subsequently the first precursor can be expelled from the reaction chamber. A second precursor can then be introduced into the reaction chamber to react with the monolayer formed from the first precursor to form a desired material from the monolayer. The utilization of the first and second precursors can be considered one cycle of the process, and multiple cycles can be utilized to form a desired material to a desired thickness. The first and second precursors are described as being within the chamber at "non-overlapping time intervals" relative to one another in that each of the precursors is substantially entirely flushed from within the reaction chamber prior to introduction of the other. The term "substantially" non-overlapping time interval is utilized to indicate that there may be some residual precursor within the chamber when a subsequent precursor is introduced into the chamber, but such residual precursor concentration will be very low, and typically low enough so that there is no detectable interaction of the precursors with one another except at the surface of substrate 1014.

In an exemplary aspect of the invention, layer 220 comprises metal nitride. In such aspect, a first precursor can comprise the metal of the metal nitride and a second precursor can comprise the nitrogen of the metal nitride. The layer 220 can be formed utilizing at least one cycle in which the first and second precursors are in the reaction chamber at different and substantially non-overlapping time intervals relative to one another. Typically, each cycle will comprise introduction of the first precursor, followed by a purge, and then followed by introduction of the second precursor. If the metal nitride is titanium nitride, exemplary precursors containing the metal of the titanium nitride are $TiCl_4$ and tetrakis-dimethyl-amido-titanium (TDMAT), and an exemplary precursor containing the nitrogen of the metal nitride is ammonia ($NH_3$).

A titanium nitride layer 220 can be formed at a temperature of from about 68° C. to about 400° C. if formed from titanium tetrachloride and ammonia, but preferably will be formed at a temperature of less than about 200° C.

In applications in which layer 220 is titanium nitride, the first precursor comprises TDMAT and the second precursor comprises ammonia, the formation of layer 220 can be accomplished utilizing multiple cycles at a temperature of from about 100° C. to about 180° C., typically from about 130° C. to about 170° C., with an exemplary temperature being 155° C.; a pressure from about 200 milliTorr to about 2 Torr, with an exemplary pressure being about 800 milliTorr; a cold wall reaction chamber; a pulse of the TDMAT into the chamber for a time of about 1 second; a purge for a time of about 10 seconds; and a second pulse of the ammonia into the reaction chamber for a time of about 4 seconds. The pulse of the ammonia can be followed by a purge for about 10 seconds, to complete an individual cycle. The purge can be accomplished utilizing vacuum and/or a suitable purge gas. The purge gas can comprise, for example, argon, and is preferably a gas which is inert relative to reaction with the precursors and any exposed materials on the substrate.

The temperatures described above for formation of a metal nitride layer are exemplary temperatures. It can be preferred, however, that temperatures utilized for formation of the layer 220 be at or below about 200° C., and more preferred that the temperatures be at or below about 160° C.

Layer 220 can be formed to any desired thickness through multiple cycles of an ALD-type process. A typical thickness of layer 220 will be at least about 100 Å, with exemplary thicknesses being from about 100 Å to about 3000 Å. If the TDMAT/$NH_3$ processing is utilized, each of the above-described cycles will typically form a layer less than or equal to about 10 Å thick (with typical layers being about 9 Å thick), and accordingly it can be desired to repeat the cycles at least about 10 times to form layer 220 to a desired thickness.

The methods described above for the TDMAT/$NH_3$ processing and the $TiCl_4$/$NH_3$ processing are ALD-like, in that the methods utilize two precursors which are provided in a reaction chamber at substantially non-overlapping times relative to one another. It is to be understood, however, that the processing utilized to form layer 220 can be any suitable processing, including CVD-type processes.

It is noted that a TiN film formed from TDMAT will frequently oxidize upon exposure to air unless treated with a post-deposition anneal of about 400° C. As will become apparent below, the metal nitride film 220 of the present invention is utilized as a substrate for a plating procedure. In such applications, the conductive properties of the film are not generally of concern, and accordingly, the film can oxidize to some extent. Thus, the post-deposition anneal typically utilized with TDMAT formation of TiN can be omitted, and the film 220 can be formed with a process which remains at or below 200° C. (typically at or below 160° C., and frequently at or below 155° C.) for the entirety of the process.

Figure 8:
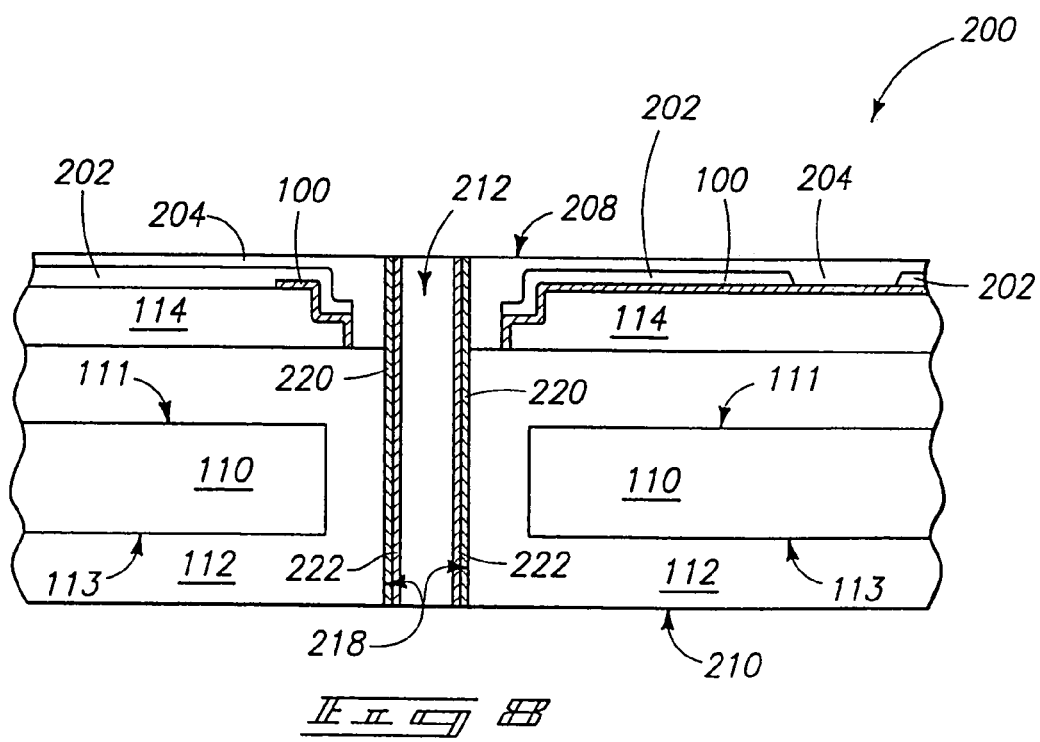
FIG. 8 is a view of the FIG. 6 fragment shown at a processing stage subsequent to that of FIG. 7.

Referring to FIG. 8, layer 220 is shown removed from over back-side surface 210 of component 200. Such removal can be accomplished utilizing any suitable etch, and/or utilizing planarization methods (such as, for example, chemical-mechanical polishing).

FIG. 8 also shows a layer 222 formed over an exposed surface of layer 220. Layer 222 represents activation of layer 220. The activation of layer 220 is accomplished by exposing layer 220 to one or both of hafnium and palladium. An exemplary method of activating a surface of layer 220 is to expose the layer to a solution comprising about 0.15 grams per liter of palladium chloride, and about 4 milliliters per liter hydrofluoric acid, with the remainder being deionized water. The exposure can be accomplished with a dip into the solution for a time of from about 30 seconds to about 60 seconds, with about 30 seconds typically being adequate at room temperature. The activation can form a separate layer 222 as shown, or can instead alter a surface composition of layer 220. Regardless, the activation prepares layer 220 for subsequent electroless deposition over the layer. In particular aspects, the activation forms the shown separate layer 222 comprising, consisting essentially of, or consisting of one or both of hafnium and palladium. Layer 222 can have a thickness of from about 1 micron to about 7 microns, with an exemplary suitable thickness being about 5 microns.

The activation of the surface of layer 220 can be performed before or after removal of layer 220 from over back-side surface 210. If layer 220 comprises hafnium or palladium, the activation of the layer can be omitted.

Figure 9:
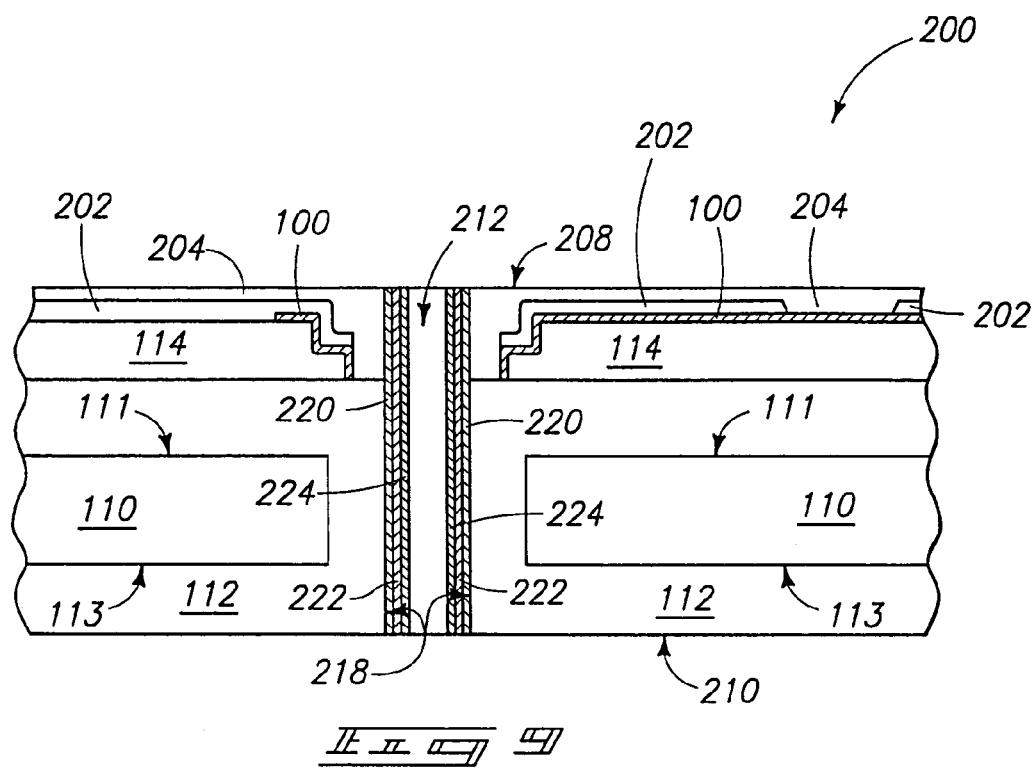
FIG. 9 is a view of the FIG. 6 fragment shown at a processing stage subsequent to that of FIG. 8.

Referring next to FIG. 9, a layer 224 is electroless plated onto activation layer 222. The material of layer 224 can be referred to as a second material to distinguish the material from the first material of layer 220. Layer 224 preferably comprises a solder-wettable material, and is formed within opening 212 to effectively line sidewalls of the opening with the solder-wettable material.

Layer 224 can comprise, consist essentially of, or consist of, for example, nickel. In such aspects, layer 224 can be formed by dipping construction 200 into a nickel hypophosphate solution utilizing an operating temperature of from about 59° C. to about 64° C., and a deposition time of from about 5 minutes to about 10 minutes. The nickel hypophosphate solution can be a solution manufactured by Shipley Corporation for utilization with p-dimethylaminobenzaldeyhyde (DMAB) applications. The nickel hypophosphate solution will typically have a pH of from about 5 to 7, with a preferred pH being about 7. The electroless-plated layer 224 can have a thickness of from about 1 micron to about 7 microns, with about 5 microns being a preferred thickness. If the thickness gets too low, a solder material formed over the nickel layer (the solder material is described below) can consume the electroless-plated layer before the opening 212 is completely filled with solder, so that the electroless-plated material does not accomplish the desired task of providing adequate wetting for solder utilized to fill opening 212.

As discussed previously, activation and subsequent electroless plating is but one of many methods that can be utilized for plating a solder-wetting material over a metal nitride. Other methods include, for example, activationless plating onto the metal nitride, and formation of a low temperature chemical vapor deposited layer onto the metal nitride followed by plating onto the low temperature chemical vapor deposited layer. If such other methods are utilized, the activation layer 222 can be omitted, or can be substituted by a low temperature chemical vapor deposited layer. Alternatively, the activation layer can be formed over a low temperature chemical vapor deposited layer which in turn is formed over the metal nitride.

Although layer 224 is shown formed after removal of layer 220 from over back-side surface 210, it is to be understood that the invention encompasses other aspects in which electroless-plated material 224 is provided prior to removal of layer 220 from over the back-side surface, and in which both the electroless-plated material and material 220 are removed from over the back-side surface.

Figure 10:
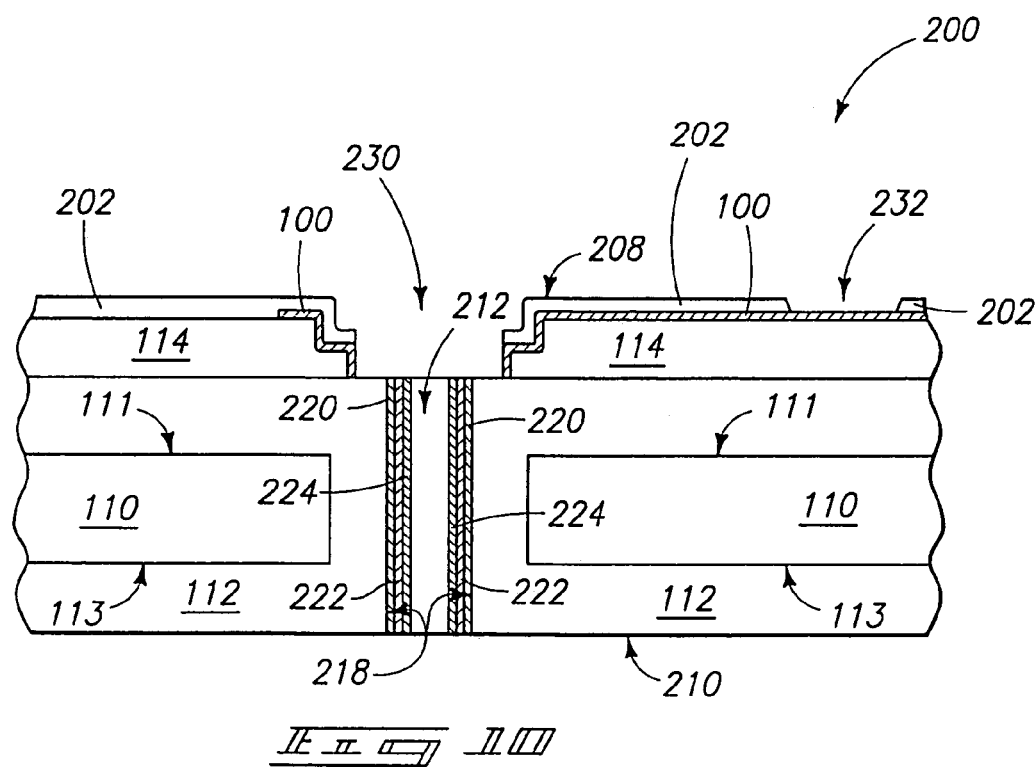
FIG. 10 is a view of the FIG. 6 fragment shown at a processing stage subsequent to that of FIG. 9.

Referring to FIG. 10, insulative-material layer 204 (FIG. 9) is removed to leave an opening 232 in the polyimide-containing layer 202 where an outer lead bond is to be formed. Also, an upper region of opening 212 is extended to form a region 230 of the opening that extends entirely across the gap within conductive-material layer 100. Accordingly, the extended region 230 of opening 212 has a periphery comprising an exposed surface of conductive material 100. In particular aspects of the invention, the opening 212 can be considered a first opening which does not extend to the conductive material 100, and the extended region 230 can be considered a portion of the first opening which is extended to reach the conductive material 100. The formation of extended region 230 can be accomplished utilizing any suitable etch. Although an entirety of insulative material 204 is shown removed during formation of extended region 230, it is to be understood that the invention encompasses other aspects in which only a portion of material 204 is removed to form the extended region 230. Regardless, at least some of the material 204 is removed.

In the shown aspect of the invention, the formation of extended region 230 occurs after activation of first material 220, and also after formation of electroless-plated material 224. It is to be understood, however, that the invention encompasses other aspects in which the extended region 230 is formed before one or both of the activation of material 220 and formation of plated material 224.

The removal of layer 204 (FIG. 9) changes the location of front-side surface 208 so that the surface is now associated with a surface of layer 202 rather than with a surface of layer 204.

Figure 11:
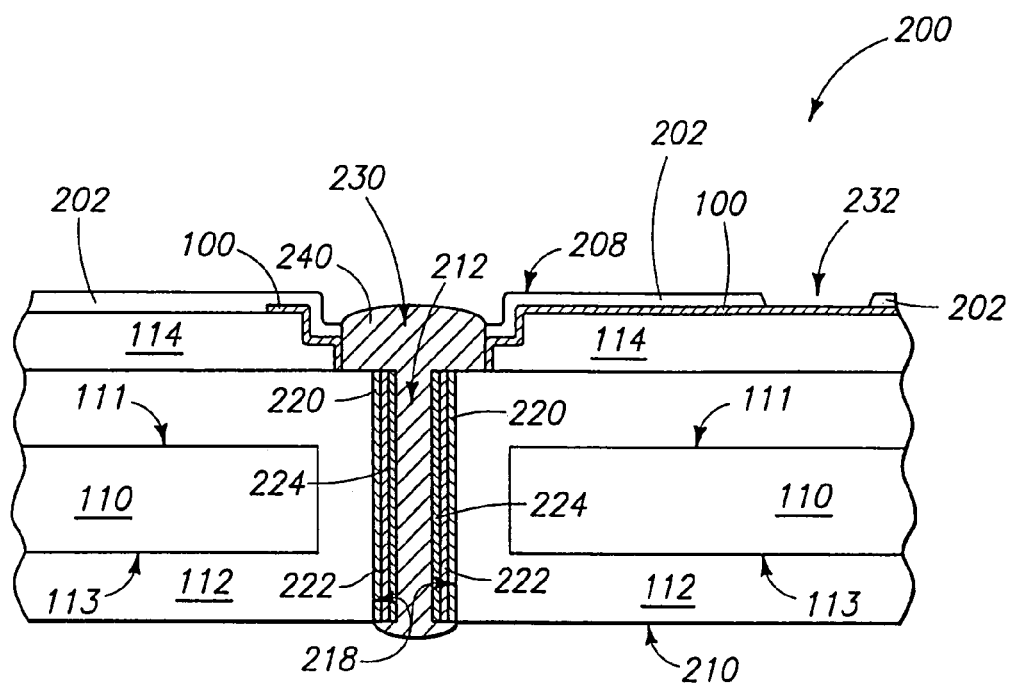
FIG. 11 is a view of the FIG. 6 fragment shown at a processing stage subsequent to that of FIG. 10.

Referring to FIG. 11, a solder 240 is provided within opening 212 and within extended region 230. Solder 240 can be provided by, for example, utilizing wave-solder methodologies which apply the solder from a back side of the component 200. Accordingly, the solder fills opening 212, but does not extend into other topgraphical features associated with the front side of component 200, including, for example, the opening 232.

Solder 240 can comprise any suitable solder composition, including, for example, compositions containing 63% tin and 37% lead (by weight), 96.5% tin and 3.4% silver (by weight), or 96.5% tin, 3% silver and 0.5% copper (by weight).

The solder-wetting material 224 advantageously assists in allowing the solder to flow into narrow opening 212 at relatively low temperatures, while providing a uniform, quality fill within the opening. Exemplary temperatures for provision of the solder within the opening are at or below about 200° C.

Figure 12:
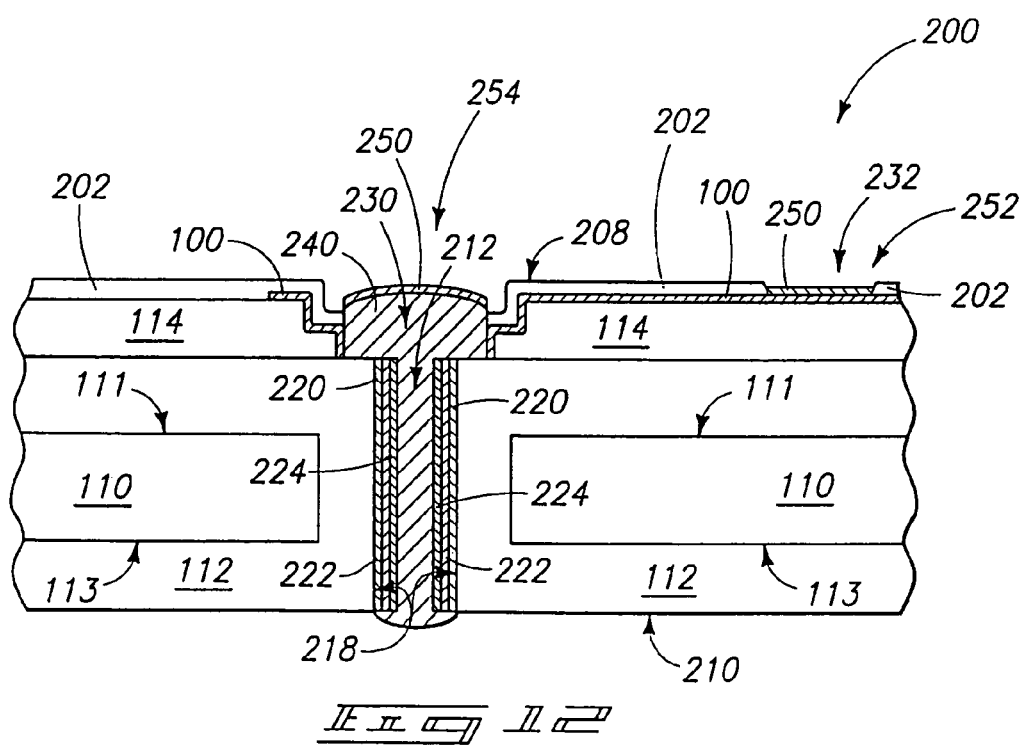
FIG. 12 is a view of the FIG. 6 fragment shown at a processing stage subsequent to that of FIG. 11.

Referring to FIG. 12, a conductive-material layer 250 is formed over exposed conductive materials 100 and 240 on front surface 208. The conductive material 250 can comprise, consist essentially of, or consist of, for example, nickel, and can be formed utilizing electroless-plating technology. The conductive material 250 within gap 232 forms a portion of an outer lead 252. The conductive material 250, together with solder 240, forms an inner lead 254 which extends within opening 212.

Figure 13:
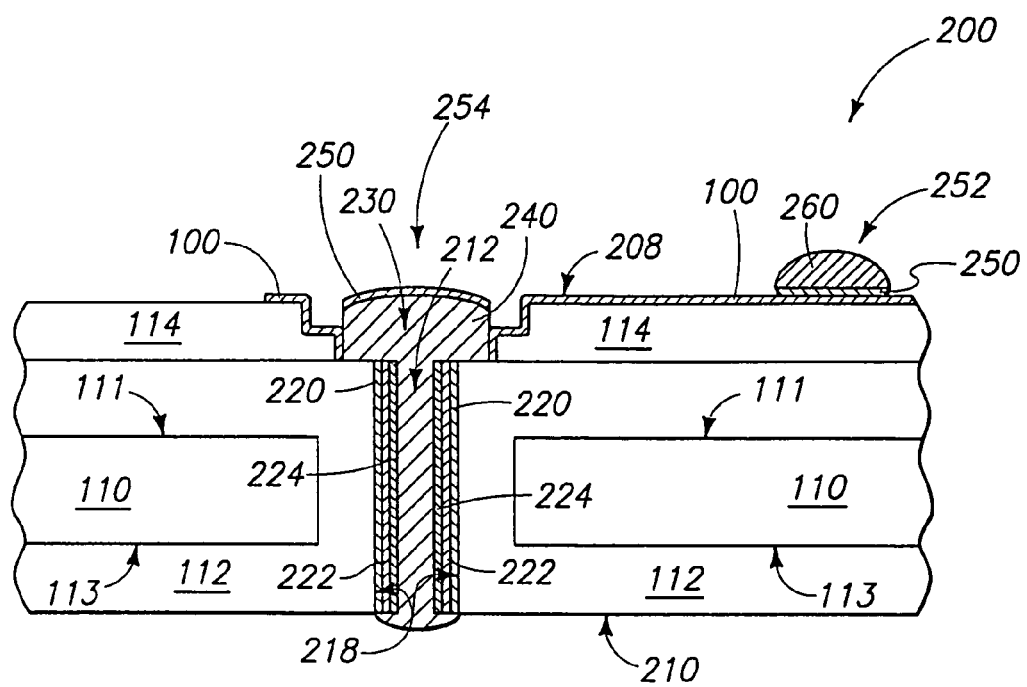
FIG. 13 is a view of the FIG. 6 fragment shown at a processing stage subsequent to that of FIG. 12.

Referring to FIG. 13, polyamide-containing material 202 (FIG. 12) is removed, and a solder ball 260 is formed over the conductive material 250 of outer lead 252. The removal of material 202 shifts the front-side surface 208 of component 200 to outer surfaces of trace 100, material 114, and exposed materials 250 and 260. Although the solder ball 260 is shown selectively formed over material 250 of outer lead 252, and not over material 250 of inner lead 254, it is to be understood that a solder ball could also be formed over the inner lead.

The processing of FIGS. 6-13 illustrates one exemplary aspect of the invention. Another exemplary aspect is described with reference to FIGS. 14-16. In referring to FIGS. 14-16, identical numbering will be used as was utilized above in describing FIGS. 6-13, where appropriate.

Figure 14:
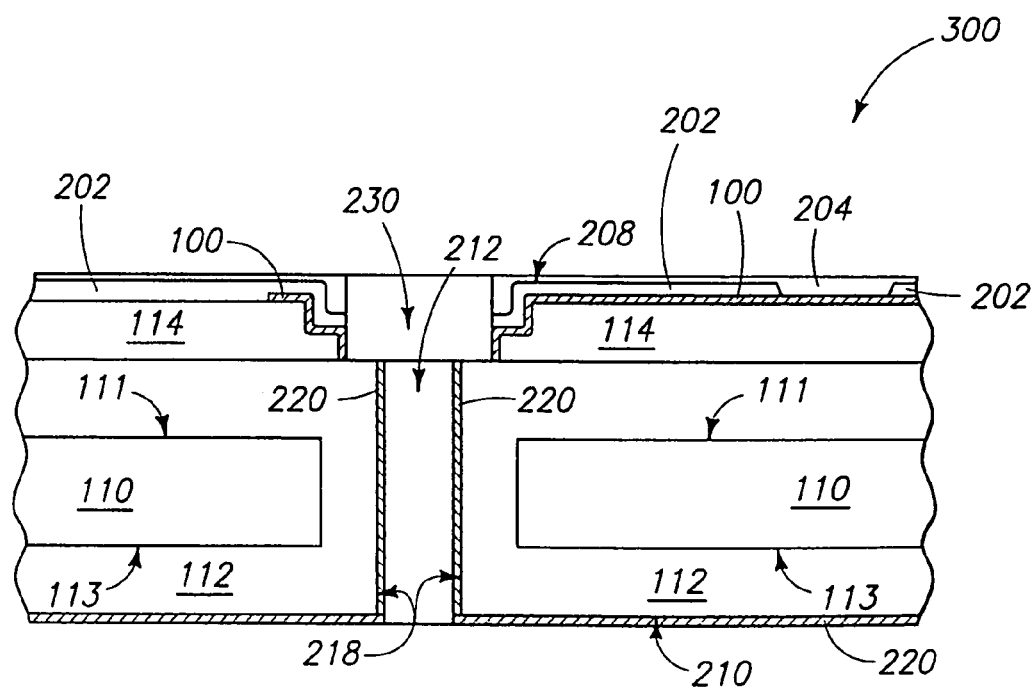
FIG. 14 is a view of the FIG. 6 fragment shown at a processing stage subsequent to that of FIG. 7 in accordance with a second aspect of the present invention.

FIG. 14 illustrates a construction 300 at a processing step subsequent to that of FIG. 7. Expanded region 230 has been formed after formation of conductive material 220, and prior to removal of conductive material 220 from back-side surface 210 of the component.

Figure 15:
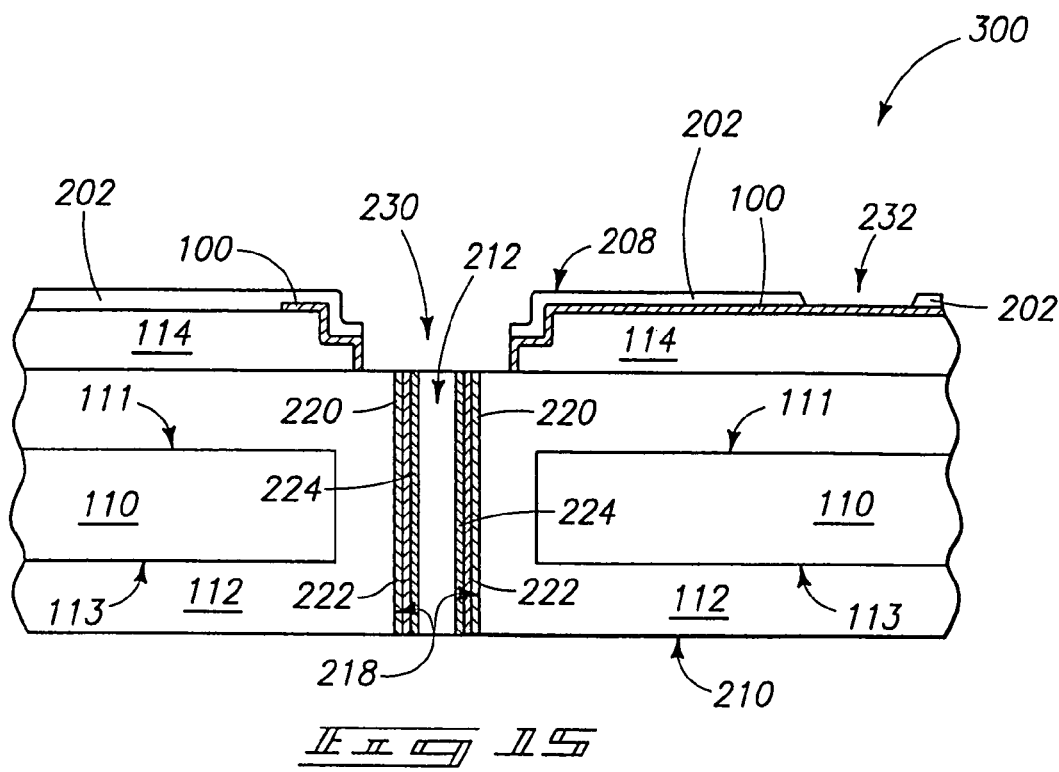
FIG. 15 is a view of the FIG. 14 fragment subsequent to that of FIG. 14.

FIG. 15 shows activation layer 222 and electroless-plated layer 224 formed along material 220. FIG. 15 also shows material 220 removed from over back-side surface 210. Such removal can occur before or after formation of one or both of activating layer 222 and electroless-plated layer 224. Additionally, FIG. 15 shows removal of insulative material 204 (FIG. 14) from over polyamide-containing material 202, which leaves a gap 232 exposed to a location where an outer lead is to be formed. The removal of material 204 preferably occurs after formation of activating layer 222 and electroless-plated layer 224, in order to avoid formation of an electroless-plated material on the conductive material 100 within opening 232. However, the invention encompasses other aspects (not shown) wherein it is desired to form an electroless-plated material within opening 232 simultaneously to forming the electroless-plating material 224 and in such aspects it can be desired to expose the conductive material 100 within opening 232 to the conditions utilized for forming layers 222 and 224.

Figure 16:
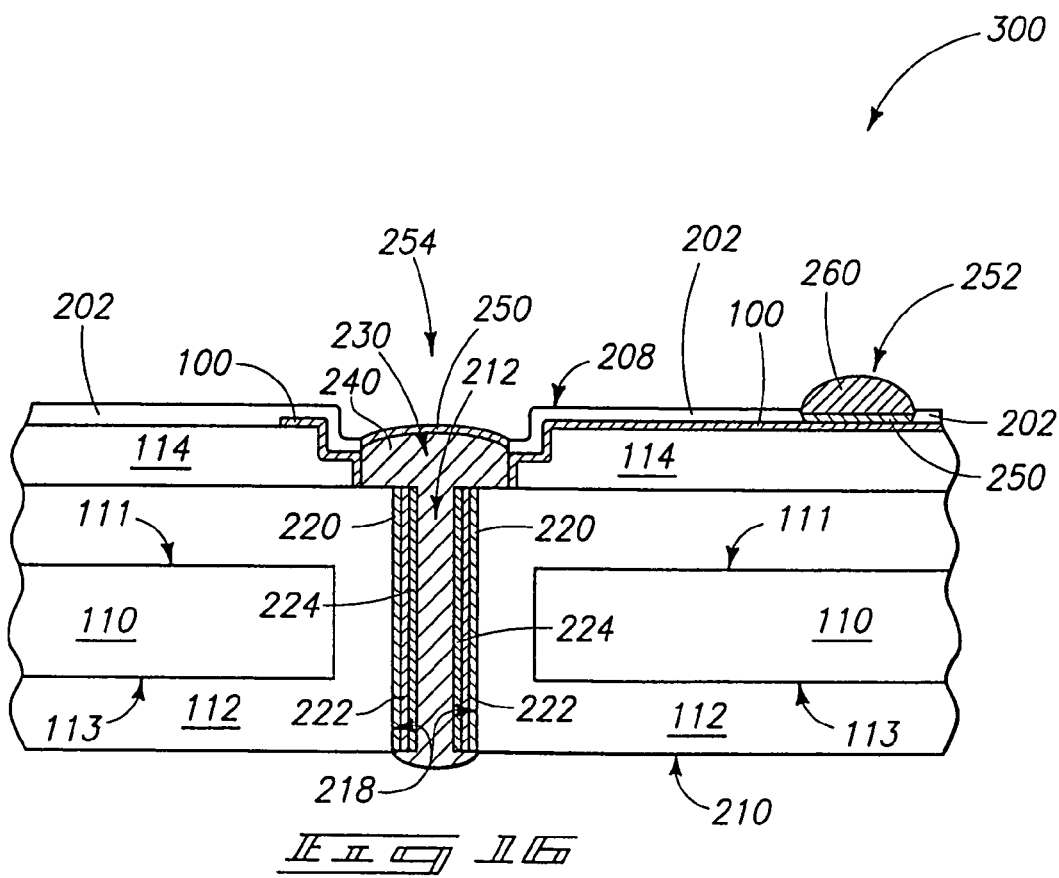
FIG. 16 is a view of the FIG. 14 fragment shown at a processing stage subsequent to that of FIG. 15.
Figure 11:
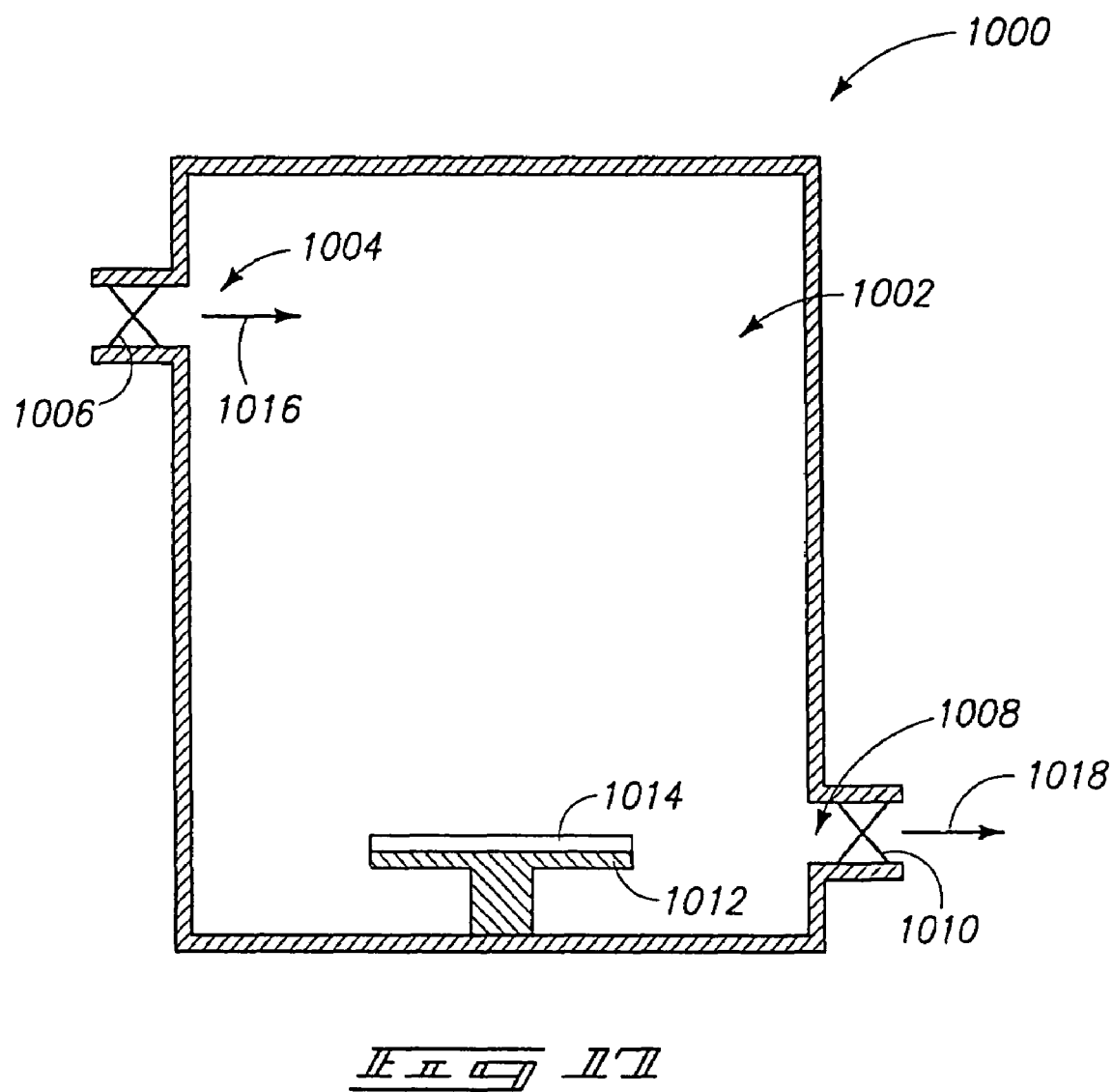

Referring to FIG. 16, solder 240 is provided within opening 212 and extended region 230, conductive-material caps 250 are provided within regions 230 and 232 (the region 232 is labeled in FIG. 15), and a solder ball 260 is provided over the conductive material 250 in opening 232. The construction of FIG. 16 is comparable to the construction of FIG. 13, but differs in that polyamide-containing material 202 has been left over the construction of FIG. 16 during formation of solder ball 260, in accordance with an alternative aspect of the invention relative to that of FIG. 13.

The low-temperature processing of the present invention can provide numerous advantages. For instance, the process can be utilized in so-called "back-end" processes where heating above the low temperatures utilized in the invention can be detrimental or is simply not possible. Additionally, methodology of the invention can be utilized with metallization of plastics and other materials that may be sensitive to temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating an interconnect, comprising:
    forming an opening extending entirely through a monocrystalline silicon substrate, the opening having sidewalls;
    depositing a first material along the sidewalls of the opening to narrow the opening, the depositing utilizing one or more cycles of a process which forms less than or equal to about 10 Å of the first material per cycle and which exposes the monocrystalline silicon substrate to a temperature of less than or equal to about 200° C.;
    forming a solder-wetting material within the opening and along the first material; and
    forming solder along the solder-wetting material to fill the opening with solder.

2. A method of fabricating an interconnect, comprising:
    forming an opening extending entirely through a monocrystalline silicon substrate, the opening having sidewalls;

depositing a first material along the sidewalls of the opening to narrow the opening, the depositing utilizing one or more cycles of a process which forms less than or equal to about 10 Å of the first material per cycle and which exposes the monocrystalline silicon substrate to a temperature of less than or equal to about 200° C.;

forming a solder-wetting material within the opening and along the first material;

forming solder along the solder-wetting material to fill the opening with solder; and wherein the first material is a metal nitride and wherein the process is conducted in a reaction chamber utilizing:
- a first precursor containing the metal of the metal nitride;
- a second precursor containing the nitrogen of the metal nitride; and
- provision of the first and second precursors in the reaction chamber at different and substantially non-overlapping time intervals relative to one another.

3. The method of claim 2 wherein the metal nitride comprises one or more of titanium nitride, tungsten nitride, tantalum nitride and hafnium nitride.

4. The method of claim 2 wherein the metal nitride comprises titanium nitride.

5. The method of claim 4 wherein the first precursor is $TiCl_4$ and the second precursor is $NH_3$.

6. The method of claim 4 wherein the first precursor is TDMAT and the second precursor is $NH_3$.

7. The method of claim 6 wherein the process utilizes, in the following sequential order:
- a first pulse of the TDMAT into the reaction chamber;
- a substantial purge of the TDMAT from the reaction chamber; and
- a second pulse of the $NH_3$ into the reaction chamber.

8. The method of claim 2 further comprising:
- forming a conductive-material layer over the monocrystalline silicon substrate;
- forming a first insulative-material layer over the conductive-material layer;
- forming a second insulative-material layer over the first insulative-material layer; and
- forming the opening to extend through the conductive-material layer and the first and second insulative-material layers.

9. The method of claim 8 wherein the first insulative-material layer comprises polyimide and the second insulative-material layer comprises silicon dioxide.

10. A method of fabricating an interconnect, comprising:
forming an opening extending entirely through a monocrystalline silicon substrate, the opening having sidewalls;

depositing a first material along the sidewalls of the opening to narrow the opening, the depositing utilizing one or more cycles of a process which forms less than or equal to about 10 Å of the first material per cycle and which exposes the monocrystalline silicon substrate to a temperature of less than or equal to about 200° C.;

forming a solder-wetting material within the opening and along the first material;

forming solder along the solder-wetting material to fill the opening with solder; and wherein the first material comprises metal nitride.

11. A method of fabricating an interconnect, comprising:
forming an opening extending entirely through a monocrystalline silicon substrate, the opening having sidewalls;

depositing a first material along the sidewalls of the opening to narrow the opening, the depositing utilizing one or more cycles of a process which forms less than or equal to about 10 Å of the first material per cycle and which exposes the monmcrystalline silicon substrate to a temperature of less than or equal to about 200° C.:

forming a solder-wetting material within the opening and along the first material;

forming solder along the solder-wetting material to fill the opening with solder; and wherein the first material comprises one or more of titanium nitride, tungsten nitride, tantalum nitride and hafnium nitride.

12. A method of fabricating an interconnect, comprising:
forming an opening extending entirely through a monocrystalline silicon substrate, the opening having sidewalls;

depositing a first material along the sidewalls of the opening to narrow the opening, the depositing utilizing one or more cycles of a process which forms less than or equal to about 10 Å of the first material per cycle and which exposes the component to a temperature of less than or equal to about 200° C.;

forming a solder-wetting material within the opening and along the first material;

forming solder along the solder-wetting material to fill the opening with solder; and wherein the forming of the solder-wetting material comprises electroless plating of the solder-wetting material.

13. The method of claim 12 wherein the first material comprises metal nitride, and further comprising activating the metal nitride with one or both of Hf and Pd prior to the electroless plating.

* * * * *

UNITED STATES PATENT AND TRADEMARK OFFICE
CERTIFICATE OF CORRECTION

PATENT NO. : 7,410,898 B2
APPLICATION NO. : 11/705897
DATED : August 12, 2008
INVENTOR(S) : Kirby et al.

It is certified that error appears in the above-identified patent and that said Letters Patent is hereby corrected as shown below:

On the Title page, in field (56), under "Foreign Patent Documents", in column 2, line 1, delete "1392510 A" and insert -- 1392610 A --, therefor.

In column 14, line 20, in Claim 11, delete "monmcrystalline" and insert -- monocrystalline --, therefor.

In column 14, line 21, in Claim 11, delete "200° C.:" and insert -- 200° C.; --, therefor.

Signed and Sealed this

Twenty-eighth Day of October, 2008

JON W. DUDAS
*Director of the United States Patent and Trademark Office*